(12) United States Patent
Ahn

(10) Patent No.: US 9,099,688 B2
(45) Date of Patent: Aug. 4, 2015

(54) DELAMINATION APPARATUS AND INLINE THERMAL IMAGING SYSTEM

(71) Applicant: SAMSUNG DISPLAY CO., LTD., Yongin, Gyeonggi-Do (KR)

(72) Inventor: Kyung-Hyun Ahn, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 0 days.

(21) Appl. No.: 14/144,719

(22) Filed: Dec. 31, 2013

(65) Prior Publication Data
US 2014/0305591 A1 Oct. 16, 2014

(30) Foreign Application Priority Data
Apr. 10, 2013 (KR) .......................... 10-2013-0039468

(51) Int. Cl.
*B32B 38/10* (2006.01)
*H01L 51/56* (2006.01)
*B32B 43/00* (2006.01)

(52) U.S. Cl.
CPC .................. *H01L 51/56* (2013.01); *B32B 38/10* (2013.01); *B32B 43/006* (2013.01); *Y10T 156/1168* (2015.01); *Y10T 156/1174* (2015.01); *Y10T 156/1911* (2015.01); *Y10T 156/1978* (2015.01)

(58) Field of Classification Search
CPC ............ B32B 43/006; Y10T 156/1168; Y10T 156/1978; Y10T 156/1174
See application file for complete search history.

(56) References Cited

U.S. PATENT DOCUMENTS

| | | | | |
|---|---|---|---|---|
| 4,880,488 A * | 11/1989 | Matsuo et al. | ................ | 156/702 |
| 5,891,298 A * | 4/1999 | Kuroda et al. | ................ | 156/716 |
| 7,798,195 B2 * | 9/2010 | Kobayashi et al. | ........... | 156/758 |
| 8,052,835 B2 * | 11/2011 | Merrill et al. | ................. | 156/707 |
| 2001/0017189 A1 * | 8/2001 | Tsujimoto et al. | ............ | 156/344 |
| 2007/0235131 A1 * | 10/2007 | Tsujimoto et al. | ............ | 156/344 |
| 2008/0185100 A1 * | 8/2008 | Jang et al. | ..................... | 156/344 |
| 2009/0288760 A1 * | 11/2009 | Garben | ......................... | 156/230 |
| 2013/0048223 A1 * | 2/2013 | Ahn | .............................. | 156/718 |
| 2013/0186574 A1 * | 7/2013 | Baker et al. | .................... | 156/707 |

FOREIGN PATENT DOCUMENTS

| | | | |
|---|---|---|---|
| JP | 2003-136595 A | | 5/2003 |
| JP | 2011-236051 A | | 11/2011 |
| KR | 10-2002-0084485 A | | 11/2002 |
| KR | 10-2009-0011168 A | | 2/2009 |

* cited by examiner

*Primary Examiner* — Mark A Osele
*Assistant Examiner* — Nickolas Harm
(74) *Attorney, Agent, or Firm* — Lee & Morse, P.C.

(57) ABSTRACT

A delamination apparatus includes a stage mounted with a lower supporting member, a donor film laminated to the lower supporting member, and an acceptor substrate sealed between the lower supporting member and the donor film, a first gripper positioned at an end side of the stage, the first gripper being configured to grip an end of the donor film and to move with the end of the donor film away from the acceptor substrate, and a first filling roll positioned over the donor film, the first filling roll being configured to blow ions toward the donor film while rotating toward the first gripper.

13 Claims, 19 Drawing Sheets

DELAMINATION APPARATUS AND INLINE THERMAL IMAGING SYSTEM

CROSS-REFERENCE TO RELATED APPLICATION

Korean Patent Application No. 10-2013-0039468, filed on Apr. 10, 2013, in the Korean Intellectual Property Office, and entitled: "Delamination Apparatus and Inline Thermal Imaging System," is incorporated by reference herein in its entirety.

BACKGROUND

1. Field

Exemplary embodiments relate to a delamination apparatus and an inline thermal imaging system including the same. More particularly, the exemplary embodiments relate to a delamination apparatus for forming an organic layer of an organic light emitting diode (OLED) display, and an inline thermal imaging system including the same.

2. Description of the Related Art

An organic light emitting element is a flat display device. Such an organic light emitting element may include an anode, a cathode, and at least one organic emission layer interleaved between the anode and the cathode. The organic light emitting element has merits of a wide viewing angle and superior contrast, as well as a fast response speed, such that it has been receiving attention as the next generation display element.

The organic light emitting element may further include at least one of organic layers interleaved among a hole injection layer (HIL), a hole transport layer (ETL), and an electron injection layer (EIL) according to whether an emission layer is made of a high molecular organic material or a low molecular organic material besides an organic emission layer.

In such an organic light emitting element, an organic layer is required to be patterned in order to realize full colors. A low molecular organic light emitting element may be patterned using a shadow mask, and a high molecular organic light emitting element may be patterned through an ink-jet printing method and a laser induced thermal imaging (LITI) method using a laser. The LITI method is advantageous because the LITI method can pattern a large area of an organic layer. Furthermore, the LITI method can pattern an organic layer with high precision and with high resolution.

SUMMARY

Exemplary embodiments have been made in an effort to provide a delamination apparatus that can minimize a failure occurring during a delamination process used in a thermal imaging method, and an inline thermal imaging system including the same.

One aspect of the exemplary embodiments provides a delamination apparatus, including a stage mounted with a lower supporting member, a donor film laminated to the lower supporting member, and an acceptor substrate sealed between the lower supporting member and the donor film, a first gripper positioned at an end side of the stage, the first gripper being configured to grip an end of the donor film and to move with the end of the donor film away from the acceptor substrate, and a first filling roll positioned over the donor film, the first filling roll being configured to blow ions toward the donor film while rotating toward the first gripper.

The first filling roll may include a fixing shaft having a first slit penetrating therethrough, the first slit being oriented from an interior of the fixing shaft toward a point between the acceptor substrate and the first gripper, air including the ions passing through the fixing shaft, an external roll surrounding the fixing shaft, the external roll rotating with respect to the fixing shaft and including a plurality of second slits along an external circumference of the external roll, the second slits penetrating in a direction of the fixing shaft, and a barrier supported by the fixing shaft, the barrier being positioned between the fixing shaft and the external roll, and the barrier including an opening facing the point between the acceptor substrate and the first gripper.

The first filling roll may further include a first ionizer inside the fixing shaft, the first ionizer being configured to generate ions toward a direction of the first slit.

The first filling roll may further include a second ionizer traversing the opening of the barrier, the second ionizer being configured to generate ions toward a direction of the first slit.

The first filling roll may further include a third ionizer at two ends of the barrier adjacent to the opening area, the third ionizer being configured to generate ions toward a direction of the first slit.

The opening of the barrier may extend along a quarter of a circumference of the barrier.

The first filling roll may further include a cover surrounding the external roll.

The cover may include a first sub-cover corresponding to the end of the donor film and blocking the second slit, a second sub-cover adjacent to the first sub-cover and corresponding to a portion of the donor film laminated with the lower support, the second sub-cover including a plurality of first penetration holes, and a third sub-cover adjacent to the second sub-cover and corresponding to the acceptor substrate, the third sub-cover including a plurality of second penetration holes smaller than the first penetration holes.

The delamination apparatus may further include a second supporting roll facing the first filling roll via the donor film.

The delamination apparatus may further include a second gripper at an end side of the stage to grip an end of the lower support, the second gripper being configured to move the end of the lower support in a direction away from the acceptor substrate, and a second filling roll over the lower support to support the lower support disposed between the acceptor substrate and the second gripper, the second filling roll being configured to rotate in a direction of the second gripper.

The delamination apparatus may further include a second support roll opposite the second filling roll, the lower support being between the second filling roll and the second support roll.

The ions may be positive ions or negative ions.

Another aspect of the exemplary embodiments provides an inline thermal imaging system including the delamination apparatus, a transferring apparatus neighboring the delamination apparatus, the transferring apparatus including a laser unit irradiating laser beams to the donor film corresponding to the acceptor film, a lamination apparatus neighboring the transferring apparatus, the lamination apparatus including a lamination unit laminating the donor film to the lower support, and a stage movement apparatus respectively moving the stage to the lamination apparatus, the transferring apparatus, and the delamination apparatus.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
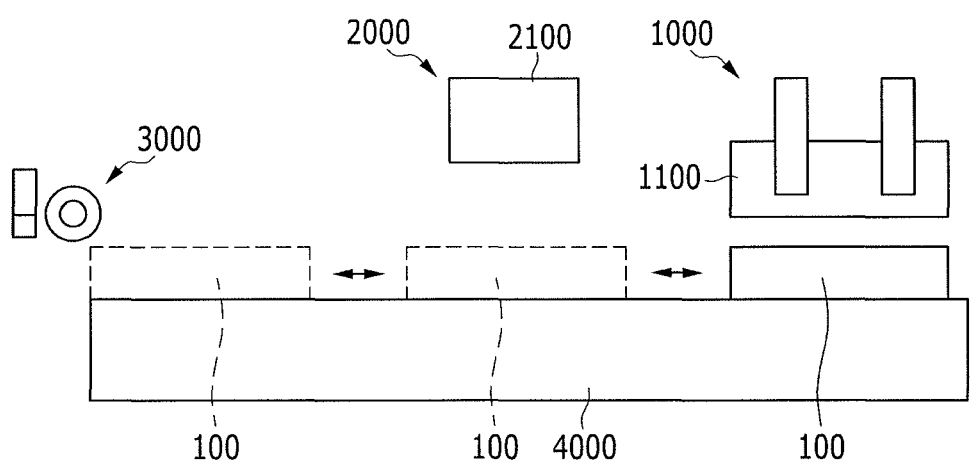
FIG. 1 illustrates a view of an inline thermal imaging system according to a first exemplary embodiment.

In the following detailed description, only certain exemplary embodiments have been shown and described, simply by way of illustration. As those skilled in the art would realize, the described embodiments may be modified in various different ways, all without departing from the spirit or scope. Accordingly, the drawings and description are to be regarded as illustrative in nature and not restrictive. Like reference numerals designate like elements throughout the specification.

For various exemplary embodiments, constituent elements having the same constitutions are designated to the same reference numerals and are explained representatively in the first exemplary embodiment. In the other exemplary embodiments, only constituent elements different from those in the first exemplary embodiment are described.

In the drawings, a size and a thickness of each element is approximately shown for better understanding and ease of description. Therefore, the exemplary embodiment is not limited to the drawings.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that when an element such as a layer, file, region, or substrate is referred to as being "on" another element, it can be on the other element or under the other element. The element may not necessarily be on another element in a gravity direction.

Hereinafter, an inline thermal imaging system according to a first exemplary embodiment will be described with reference to FIG. 1 to FIG. 13.

FIG. 1 illustrates a view of an inline thermal imaging system according to the first exemplary embodiment.

As illustrated in FIG. 1, an inline thermal imaging system according to the first exemplary embodiment is an inline system in which a donor film is laminated to an acceptor substrate, an organic layer formed in the donor film is transferred by irradiating laser beams, and the donor film is delaminated from the acceptor film. Therefore, the inline thermal imaging system may include a lamination apparatus 1000, a transferring apparatus 2000, a delamination apparatus 3000, and a stage moving apparatus 4000. The stage moving apparatus 4000 moves stages 100, to which the acceptor substrate is mounted, to the lamination apparatus 1000, the transferring apparatus 2000, and the delamination apparatus 3000, respectively, and may include a moving unit, e.g., a rail and the like, and a driving unit, e.g., a motor and the like, to drive the moving unit. The stages 100 moved by the stage moving apparatus 4000 are respectively moved to the lamination apparatus 1000, the transferring apparatus 2000, and the delamination apparatus 3000.

Figure 2:
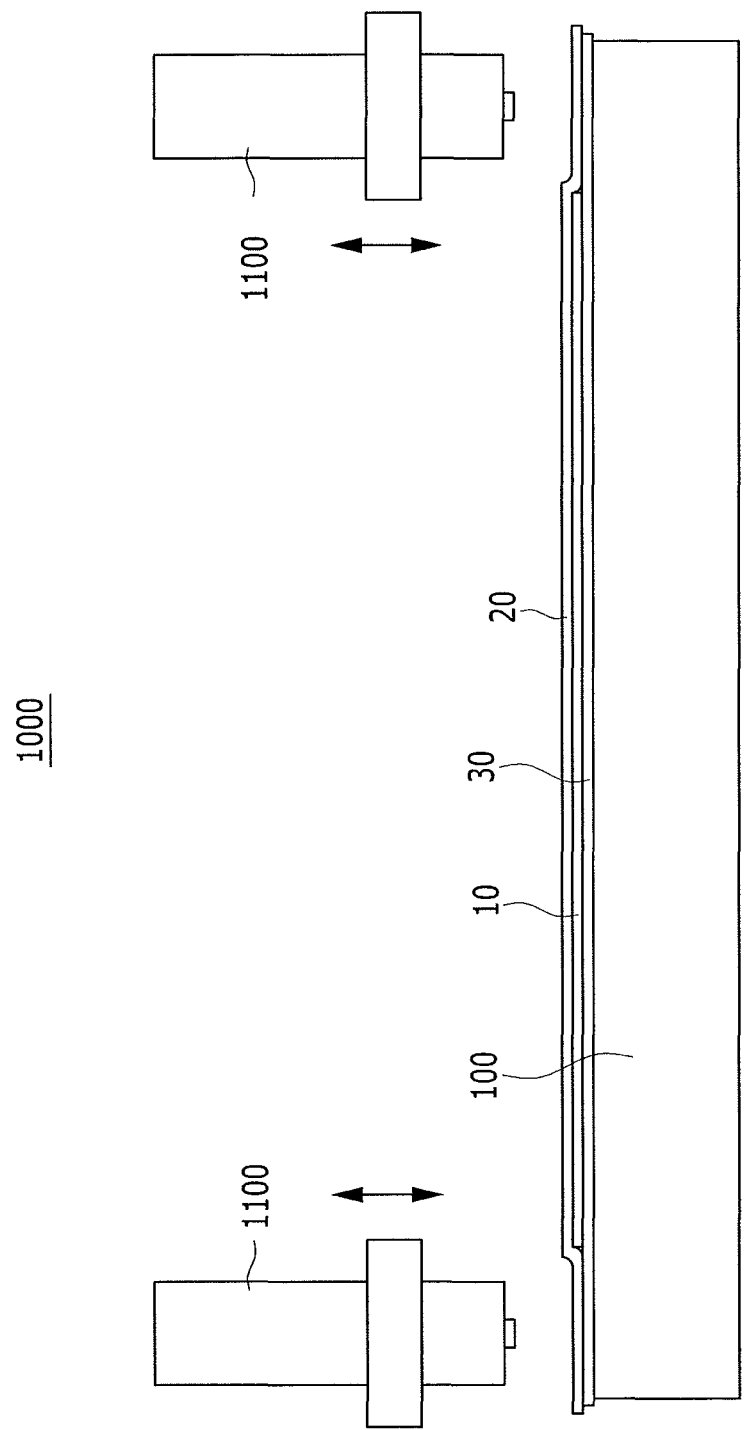
FIG. 2 illustrates a view of the lamination apparatus shown in FIG. 1.

FIG. 2 illustrates a detailed schematic view of the lamination apparatus 1000. Referring to FIG. 2, the lamination apparatus 1000 is an apparatus for laminating a donor film 20 to an acceptor substrate 10, and may include the stage 100 and a lamination unit 1100.

In detail, referring to FIG. 2, a lower support 30 formed in the shape of a film, the acceptor substrate 10 disposed on the lower support 30, and the donor film 20 laminated with the lower support 30 along the edge of the acceptor substrate 10, interposing the acceptor substrate 10 therebetween, may be mounted to the stage 100. The stage 100 may include a stage alignment key that corresponds to an alignment key formed in the acceptor substrate 10.

The lamination unit 1100 is movable up and down with respect to the stage 100 and maintains an area where the acceptor substrate 10 is located in a vacuum state. Then, the lamination unit 1100 adheres, e.g., attaches, the donor film 20 and the lower support 30, e.g., using heat and the like, along the edge of the acceptor substrate 10 of the stage 100. Accordingly, the lower support 30 and the donor film 20 are laminated, interposing the acceptor substrate 10 therebetween, such that the acceptor substrate 10 is sealed between the donor film 20 and the lower support 30. In other words, as illustrated in FIG. 2, the lamination unit 1100 may directly attach the donor film 20 to the lower support 30 along peripheral edges thereof, with the acceptor substrate 10 completely sealed therebetween. Here, the lower support 30 may be disposed between the stage 100 and the acceptor substrate 10 and between the stage 100 and the donor film 20.

In the first exemplary embodiment, the lower support 30 is disposed between the stage 100 and the acceptor substrate 10 and between the stage 100 and the donor film 20. However, when the lower support 30 is omitted in another exemplary embodiment, the donor film 20 may be directly bonded with a stage 100 along the edge of an acceptor substrate 10.

Figure 3:
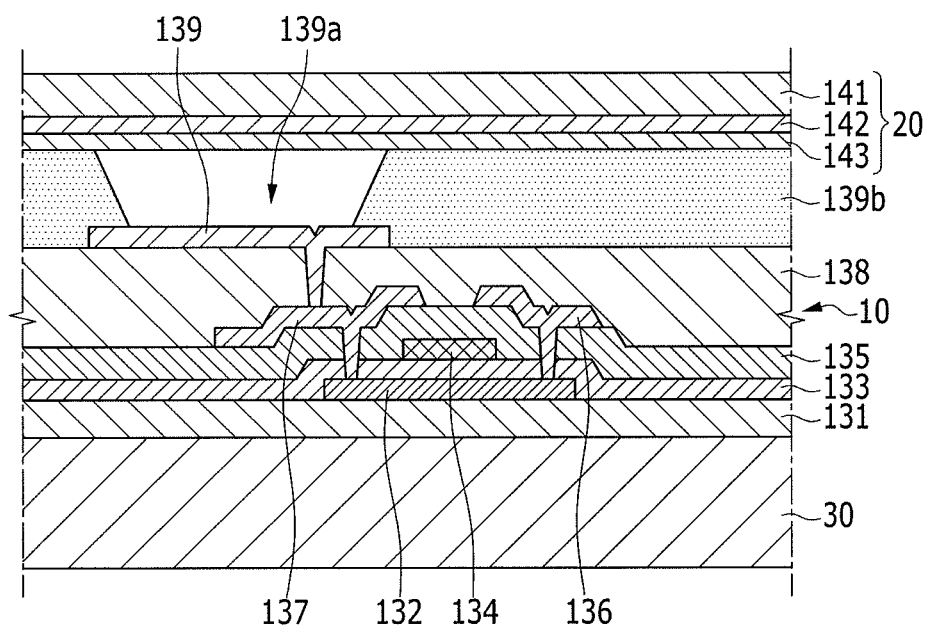
FIG. 3 illustrates a cross-sectional view of an acceptor substrate laminated with a donor film using the lamination apparatus shown in FIG. 2.

Hereinafter, the acceptor substrate 10 laminated with the donor film 20 will be described with reference to FIG. 3. FIG. 3 illustrates a partial cross-sectional view of the acceptor substrate 10 laminated with the donor film 20 using the lamination apparatus 1000.

As shown in FIG. 3, in the acceptor substrate 10, a semiconductor layer 132 is disposed in a predetermined area on a substrate 131, which is on the lower support 30. The semiconductor layer 132 may be an amorphous silicon layer or a polysilicon layer crystallized from the amorphous silicon layer. A gate insulating layer 133, i.e., a first insulating layer, is disposed on the semiconductor layer 132. A gate electrode 134 overlapping the semiconductor layer 132 is disposed on the gate insulating layer 133. A second insulating layer 135 covering the semiconductor layer 132 and the gate electrode 134 is disposed on the gate electrode 134. A source electrode 136 and a drain electrode 137 respectively connecting lateral ends of the semiconductor layer 132 penetrating the second insulating layer 135 and the first insulating layer 133 are disposed on the second insulating layer 135. The semiconductor layer 132, the gate electrode 134, and the source and drain electrodes 136 and 137 form a thin film transistor T.

A third insulating layer 138 covering the source and drain electrodes 136 and 137 is disposed on the source and drain electrodes 136 and 137. The third insulating layer 138 may be a passivation layer for protecting the thin film transistor T and/or a planarization layer for reducing a step difference due to the thin film transistor T. A pixel electrode 139 connected with the drain electrode 137 is disposed on the third insulating layer 138 while penetrating the third insulating layer 138. The pixel electrode 139 may be, e.g., an indium tin oxide (ITO) layer or an indium zinc oxide (IZO) layer. A pixel defining layer 139b having an opening that partially exposes the pixel electrode 139 may be disposed on the pixel electrode 139.

The donor film 20 laminated on the acceptor substrate 10 may include a base film 141, a light to heat conversion layer 142, and an organic layer 143. In other words, as illustrated in FIG. 3, a lowermost layer of the donor film 20 may be the organic layer 143, such that the organic layer 143 may be on, e.g., directly on, the pixel defining layer 139b of the acceptor substrate 10. The light to heat conversion layer 142 and the organic layer 143 may be sequentially stacked on one side of the base film 141, and the donor film 20 may have a predetermined elasticity. The base film 141 may be made of a transparent high molecular organic material, e.g., polyethylene terephthalate (PET), polyethylene naphthalate (PEN), polyethylene (PE), polycarbonate (PC), and polyimide (PI). The light to heat conversion layer 142 may convert incident light, which is laser light, to heat. The light to heat conversion layer 142 may include a light absorption material, e.g., aluminum oxide, aluminum sulfide, carbon black, graphite, or an infrared ray dye. The organic layer 143 may be at least one of a hole injection layer (HIL), a hole transport layer (HTL), an electro-luminescence layer, a hole suppression layer, an electron transport layer (ETL), and an electron injection layer (EIL).

Figure 4:
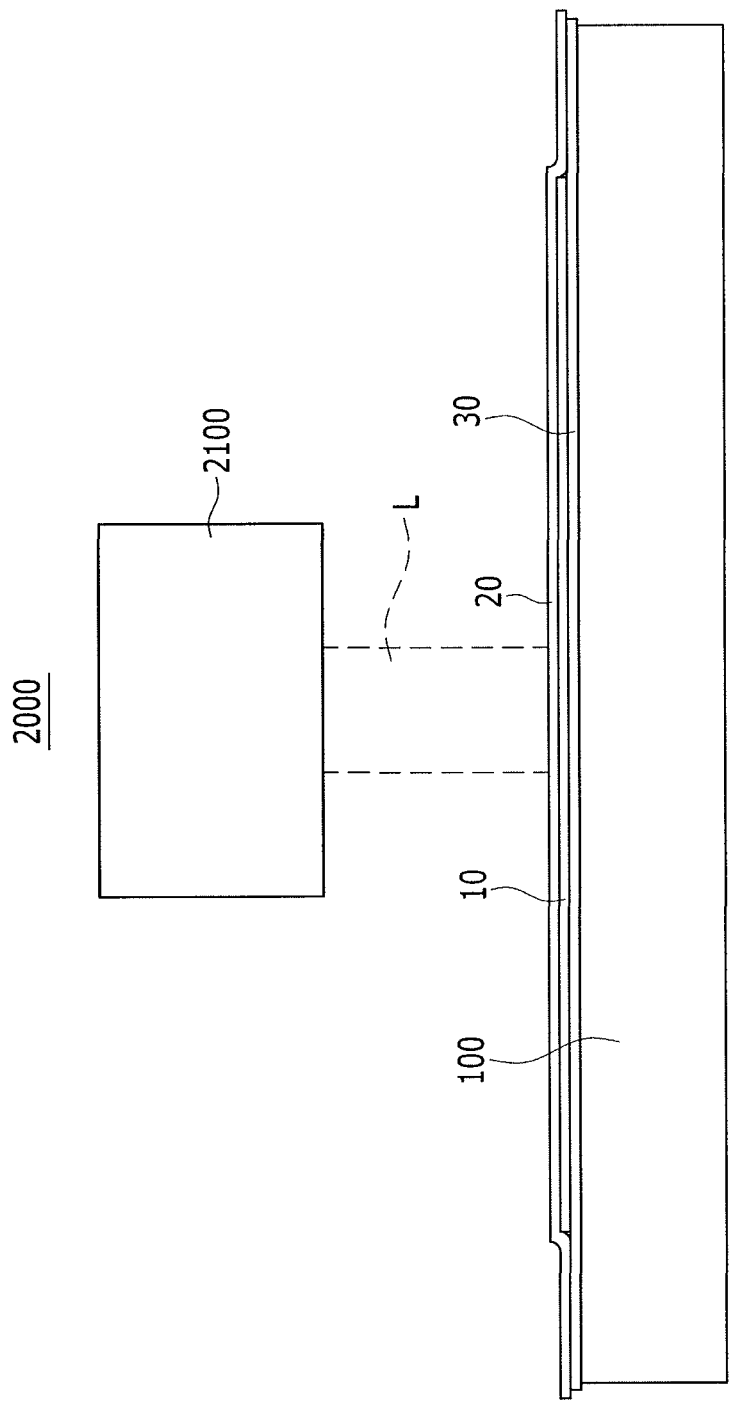
FIG. 4 illustrates a view of a transferring apparatus shown in FIG. 1.

FIG. 4 illustrates a schematic detailed view of the transferring apparatus 2000. Referring to FIG. 1, the transferring apparatus 2000 may be disposed between the lamination apparatus 1000 and the delamination apparatus 3000, and may transport an organic layer of the donor film 20 laminated on the acceptor substrate 10.

In detail, referring to FIG. 4, once the laminated donor film 20 and lower support 30 are transported from the lamination apparatus 1000 to the transferring apparatus 2000, the laminated donor film 20 and lower support 30 are positioned on the stage 100 of the transport apparatus 2000. As illustrated in FIG. 4, the transferring apparatus 2000 may include a laser unit 2100 above the stage 100, so the laser unit 2100 may radiate a laser L at the donor film 20 corresponding to a substrate area of the stage 100. As illustrated in FIG. 4, the donor film 20 is an uppermost film on the structure positioned on the stage 100, so irradiation of the laser L toward the donor film 20 causes transfer of the organic layer 143 of the donor film 20 to the acceptor substrate 10. The laser L may be radiated to the donor film 20 corresponding to an opening 139a of the acceptor substrate 10 (FIG. 3).

The transferring apparatus 2000 may include a thermal imaging unit instead of the laser unit 2100. In this case, the thermal imaging unit may transfer the organic layer 143 formed in the donor film 20 to the acceptor substrate 10 by applying heat to the donor film 20.

Figure 5:
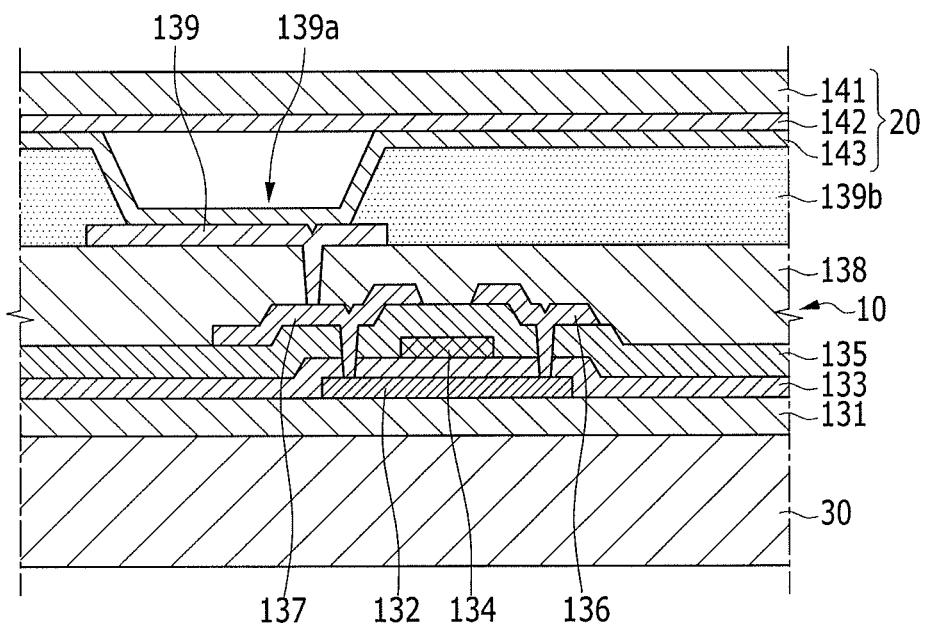
FIG. 5 illustrates a cross-sectional view of an acceptor substrate to which an organic layer of the donor film is transferred using the transferring apparatus shown in FIG. 4.

Hereinafter, the acceptor substrate 10 with the transferred organic layer 143 of the donor film 20 will be described with reference to FIG. 5. FIG. 5 illustrates a partial cross-sectional view of the acceptor substrate 10 with the organic layer 143 of the donor film 20 transferred using the transport apparatus 2000.

As shown in FIG. 5, the organic layer 143 may be transferred to the acceptor substrate 10 corresponding to the opening 139a of the acceptor substrate 10. For example, as illustrated in FIG. 5, the organic layer 143 may be attached to the acceptor substrate 20 to be directly and conformally on the pixel define layer 139b and the opening 139a, i.e., on sidewalls of the opening 139a and on the pixel electrode 139.

Figure 6:
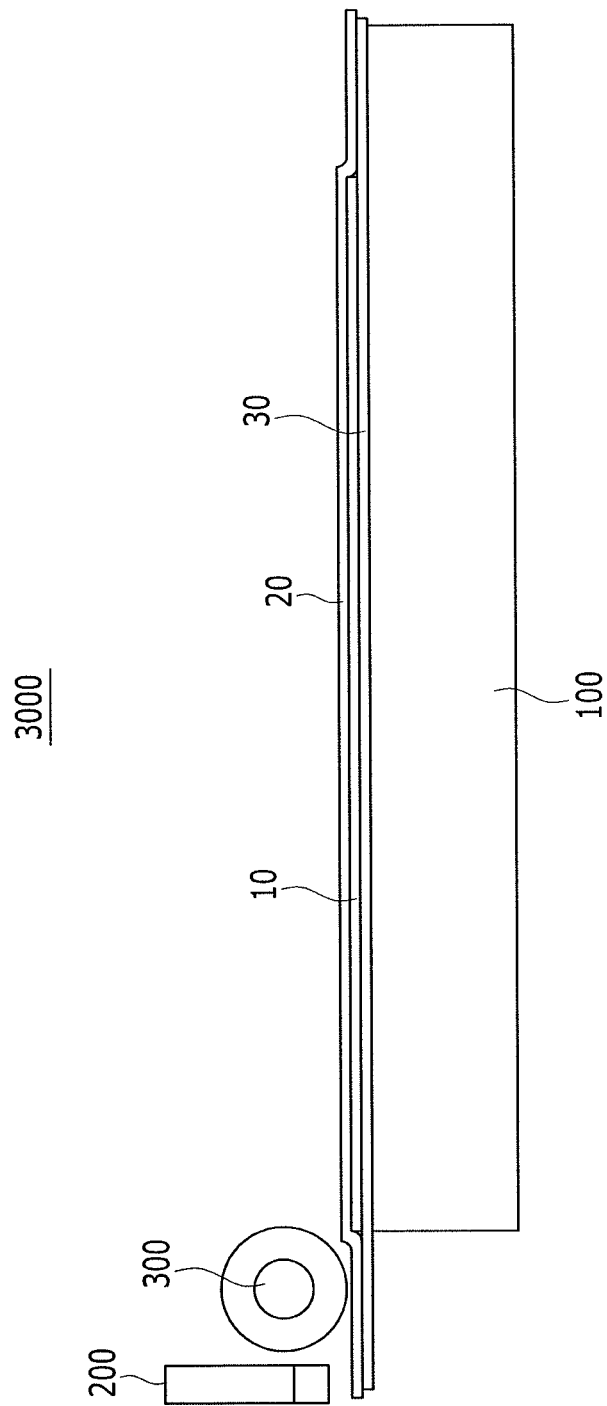
FIG. 6 to FIG. 8 illustrate views of a delamination apparatus shown in FIG. 1.
Figure 7:
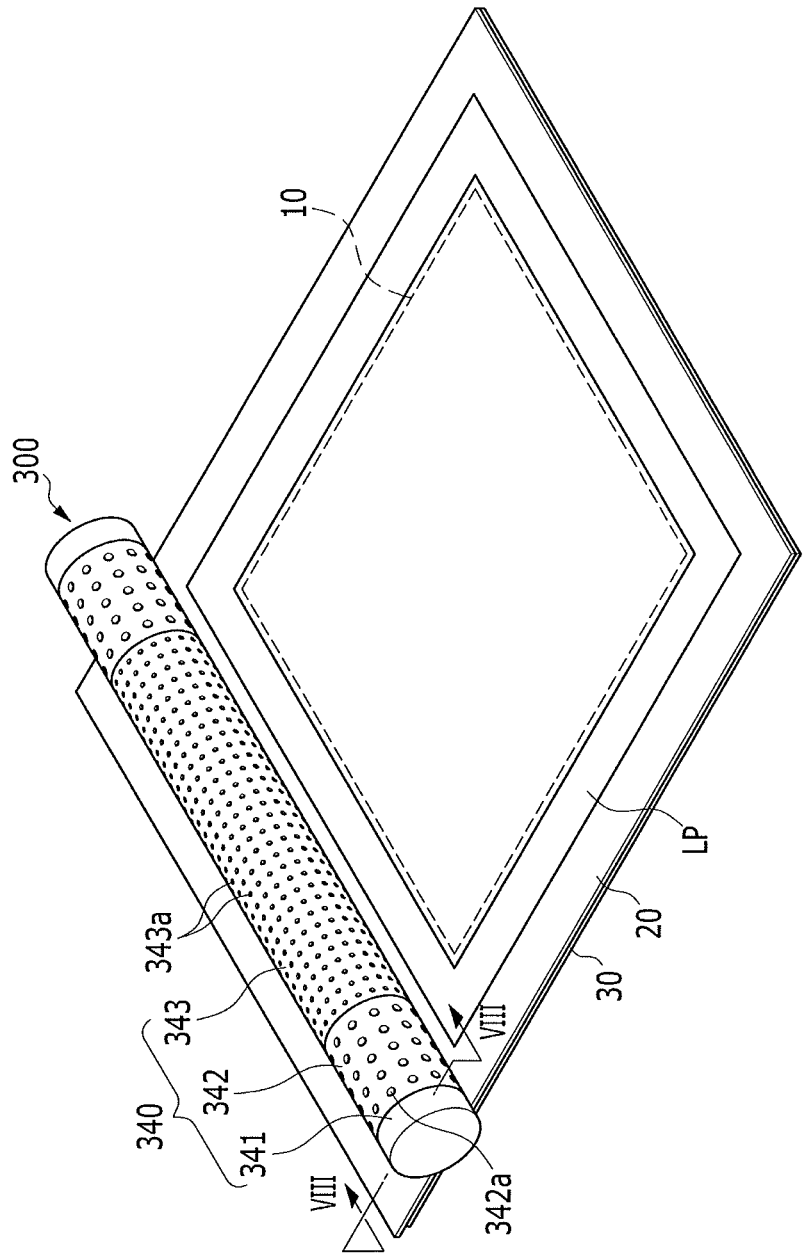
Figure 8:
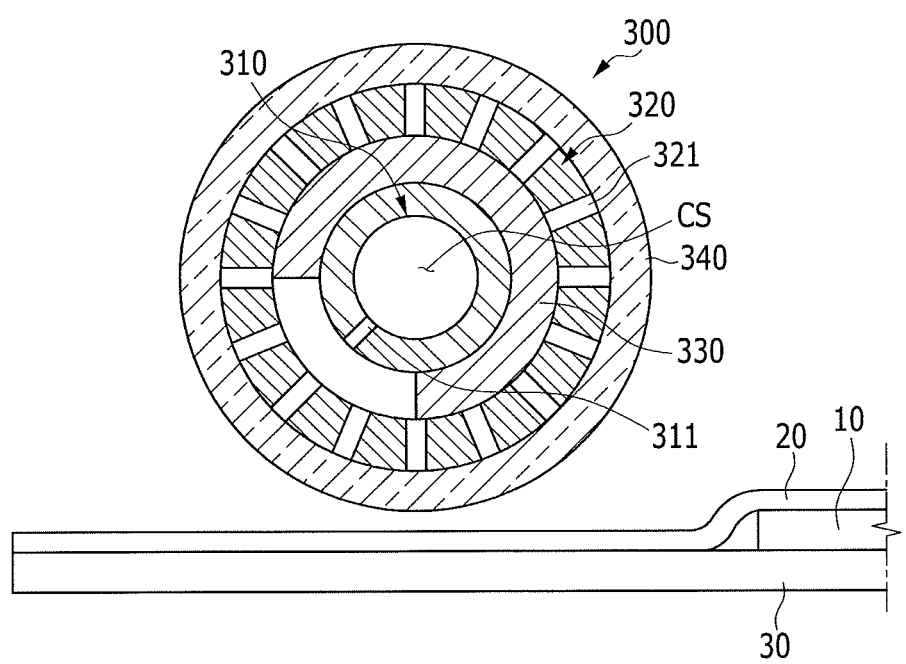

FIG. 6 to FIG. 8 illustrate enlarged views of the delamination apparatus 3000.

Referring to FIG. 1, the delamination apparatus 3000 is adjacent to the transferring apparatus 2000. The delamination apparatus 3000 delaminates the donor film 20 from the acceptor substrate 10, after the organic layer 143 is transferred from the donor film 20 to the acceptor substrate 10.

Referring to FIG. 6, the delamination apparatus 3000 may include the stage 100, a first gripper 200, and a first filling roll 300.

The first gripper 200 is disposed at an end of the stage 100, and grips the end of the donor film 20, which faces the first gripper 200. The first gripper 200 moves, e.g., pulls, the donor film 20 in a direction away from the acceptor substrate 10, e.g., upward, by gripping the end of the donor film 20 to separate the end of the donor film 20 from the lower support 30. When the first gripper 200 separates the end of the donor film 20 from the lower support 30, the donor film 20 contacts the first filling roll 300, as will be described in detail below with reference to FIGS. 7-8.

FIG. 7 illustrates a perspective view from the top of the first filling roll 300, the lower support 30, the acceptor substrate 10, and the donor film 20. FIG. 8 is a cross-sectional view along the line VIII-VIII of FIG. 7.

As shown in FIG. 6 to FIG. 8, the first filling roll 300 is disposed on the donor film 20. The first filling roll 300 supports the donor film 20 disposed between the acceptor substrate 10 and the first gripper 200. Here, the supporting of the donor film 20 implies blowing the donor film 20 to be supported.

The first filling roll 300 rotates around itself in a direction of the first gripper 200. For example, referring to FIG. 1, the first filling roll 300 rotates in a clockwise direction, e.g., right, to delaminate the donor 20 from the lower support 30. The first filling roll 300 may include a fixing shaft 310, an external roll 320, a barrier 330, and a cover 340.

The fixing shaft 310 may include a connection space CS through which air or gas, e.g., nitrogen (N) or oxygen (O), is blown, and a first slit 311 penetrating the fixing shaft 310 along a radial direction, e.g., from the inside of the connection space CS toward a point between the acceptor substrate 10 and the first gripper 200. The fixing shaft 310 is disposed in a fixed state on the donor film 20, and does not rotate. The fixing shaft 310 may be connected to an ion supply unit (not shown) supplying ions to the connection space CS, and the ion supply unit (not shown) may include an electrode tip supplied with power to generate positive ions or negative ions. Also, the ions passing through the connection space CS of the fixing shaft 310 may be selected as positive ions or negative ions corresponding to negative charges or positive charges arranged on the surface of the donor film 20 according to each material of the acceptor substrate 10 and the donor film 20.

The external roll 320 surrounds the fixing shaft 310, and rotates with respect to the fixing shaft 310. The external roll 320 includes a plurality of second slits 321 disposed along the outer part, e.g., along an entire perimeter of the external roll 320, and penetrating the external roll 320 along the radial direction, e.g., oriented toward the fixing shaft 310. A bearing may be provided between the external roll 320 and the fixing shaft 310, and the first filling roll 300 rotates by itself as the external roll 320 rotates by itself.

The barrier 330 supported by the fixing shaft 310 is disposed between the fixing shaft 310 and the external roll 320, and opens in a direction between the acceptor substrate 10 and the first gripper 200. For example, the barrier 330 may only partially surround an outer part of the fixing shaft 310, so about a quarter of the perimeter of the fixing shaft 310 is open and not surrounded, e.g., overlapped, by the barrier 330. That is, the barrier 330 opens a quarter of the entire area of the external circumference of the barrier 330. For example, the barrier 330 opens an area in a direction rotated 90 degrees in a clockwise direction from a direction that is perpendicular to the plate surface of the donor film 20 among the entire area of the external circumference of the barrier 330.

The air passing through the connection space CS may move in a direction of the second slit 321 from the first slit 311. When air passing through the connection space CS moves in the second slit 321 direction from the first slit 311, the first filling roll 300 blows air toward the donor film 20, so an air layer is formed between the first filling roll 300 and the donor film 20. Accordingly, the blown air layer supports the donor film 20 disposed between the acceptor substrate 10 and the first gripper 200.

The cover 340 surrounds the external roll 320, and includes a first sub-cover 341, a second sub-cover 342, and a third sub-cover 343. The first sub-cover 341 is disposed corresponding to an end, e.g., edge, of the donor film 20, as illustrated in FIG. 7, and blocks the second slit 321 of the external roll 320, e.g., as illustrated in FIG. 8. The second sub-cover 342 is adjacent to the first sub-cover 341 and is disposed to correspond to, e.g., overlap, a portion LP of the donor film 20 laminated with the lower support 30 (FIG. 7). The second sub-cover 342 includes a plurality of first penetration holes 342a formed along the external circumference. The air passing through the connection space CS of the fixing shaft 310 passes through the first slit 311, the second slit 321, and the first penetration hole 342a toward the portion LP of the donor film 20.

The third sub-cover 343 is adjacent to the second sub-cover 342 and is disposed to correspond to, e.g., overlap, the acceptor substrate 10. The third sub-cover 343 includes a plurality of second penetration holes 343a formed along the external circumference. The second penetration holes 343a are formed to be smaller than the first penetration holes 342a. The air having passed through the connection space CS of the fixing shaft 310 passes through the first slit 311, the second slit 321, and the second penetration hole 343a.

Hereinafter, a delamination process using the delamination apparatus 3000 will be described in further detail with reference to FIG. 9 to FIG. 12. FIG. 9 to FIG. 12 are provided for description of the delamination process using the delamination apparatus of FIG. 6 to FIG. 8.

Figure 9:
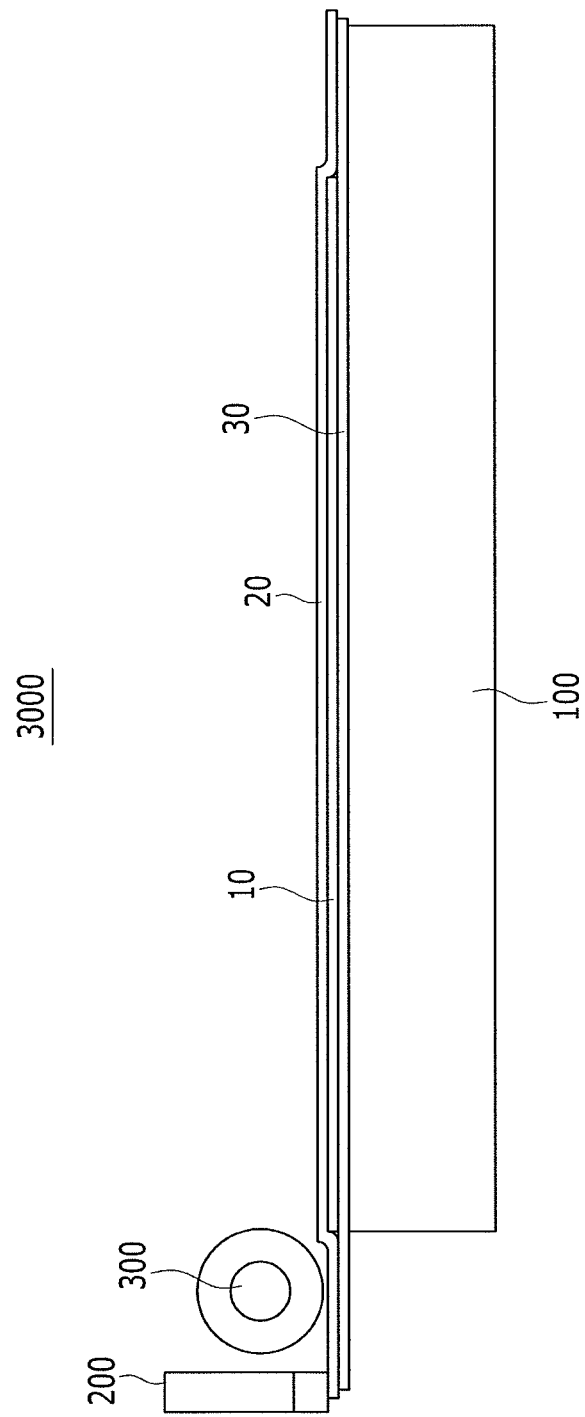
FIG. 9 to FIG. 12 illustrate views to explain a delamination process using the delamination apparatus shown in FIG. 6 to FIG. 8.

First, as shown in FIG. 9, the end of the donor film 20 is gripped using the first gripper 200. In this case, the first filling roll 300 is disposed on the donor film 20, and may contact the donor film 20 or may be separated from the donor film 20.

Figure 10:
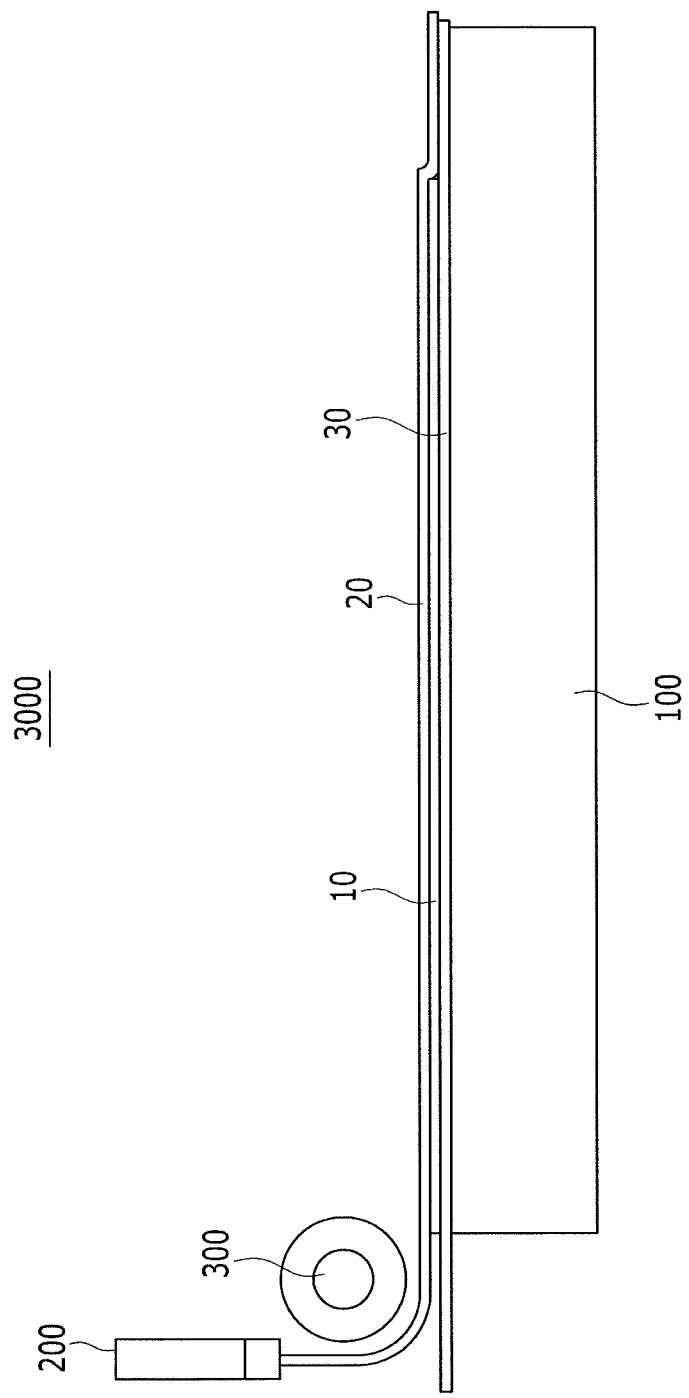

Next, as shown in FIG. 10, the first gripper 200 is moved to an upper side, e.g., upward, to separate, e.g., pull away, the end of the donor film 20 from the lower support 30. Once the edge of the donor film 20 is separated from the lower support 30, a remainder of the donor film remains over the acceptor substrate 10 and is supported, e.g., to remain in place, by the air blown from the first filling roll 300.

Figure 11:
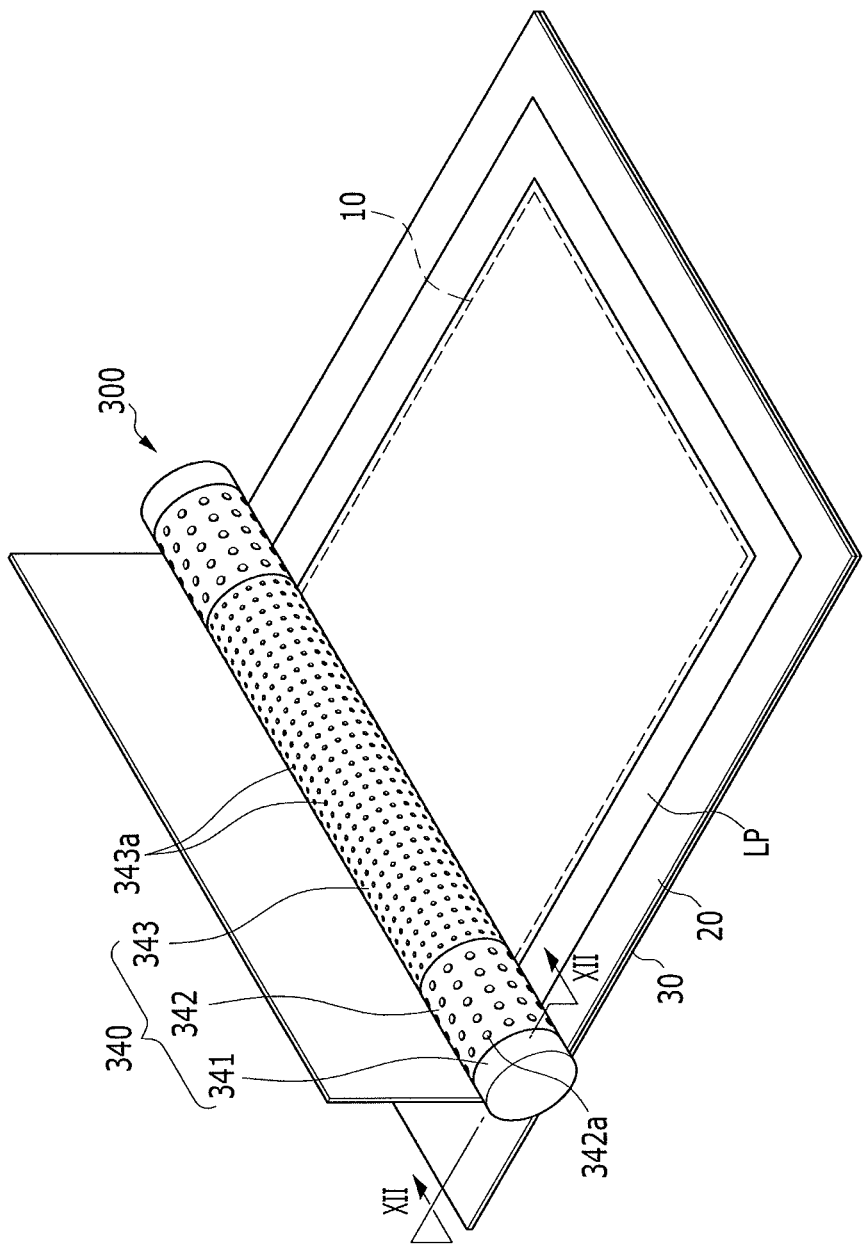
Figure 12:
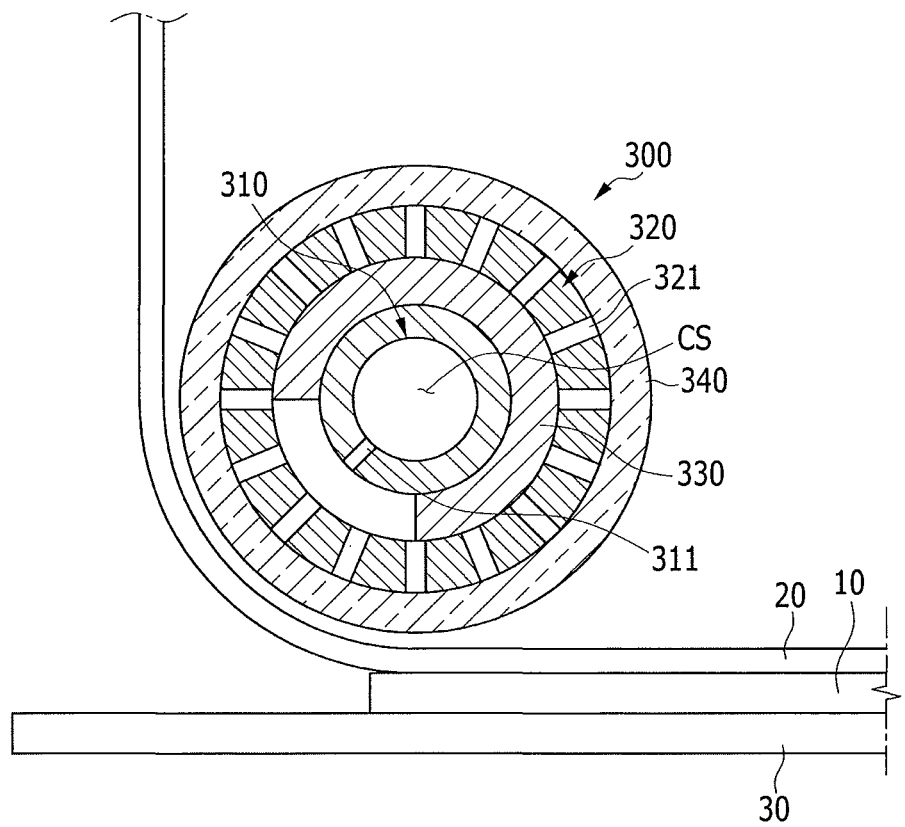

FIG. 11 illustrates the first filling roll 300, the lower support 30, the acceptor substrate 10, and the donor film 20 shown in FIG. 10. FIG. 12 is a cross-sectional view of FIG. 11, taken along the line XII-XII.

Next, as shown in FIG. 11 and FIG. 12, the first filling roll 300 rotates itself, e.g., rolls away from the separated edge of the donor film 20, thereby removing the air layer supporting the donor film 20 on the acceptor substrate 10. Thus, the donor film 20 is delaminated from the lower support 30.

In further detail, since the air is sucked or blown in the direction between the acceptor substrate 10 and the first gripper 200, while the external roll 320 rotates with respect to the shaft axis 310 that is in the fixed state, the first filling roll 300 rotates itself while the donor film 20 disposed between the acceptor 10 and the first gripper 200 is supported by the first filling roll 300 so that the donor film 20 is delaminated from the lower support 30.

In this case, the end of the donor film 20 is pressed by the first sub-cover 341 corresponding to the first sub-cover 341 that blocks the second slit 321 of the external roll 320, so that the end of the donor film 20 can be prevented from being lifted due to suction or blowing of the first filling roll 300. Thus, particles that can be generated due to separation of the donor film 20 from the lower support 30 or external air can be prevented from penetrating into the acceptor substrate 10 disposed between the donor film 20 and the lower support 30.

In addition, since the portion LP of the donor film 20 laminated with the lower support 30 is supported by the first filling roll 300 corresponding to the second sub-cover 342 including the first penetrating hole 342a formed to be larger than the second penetrating hole 343a, air suction or blowing is locally performed with high pressure, e.g., only in the portion LP. Therefore, the delamination from the lower support 30 can be easily performed.

In addition, the center area of the donor film 20 corresponding to the acceptor substrate 10 is supported by the first filling roll 300 corresponding to the third sub-cover 343 including the second penetration hole 343a formed to be smaller than the first penetration hole 342a. Therefore, air suction or blowing is locally performed with low pressure, e.g., only over the acceptor substrate 10. Therefore, a failure in the acceptor substrate 10, e.g., that may occur from delamination of the donor film 20 form the lower support 30, may be suppressed.

According to embodiments, as described above, the first filling roll 300 supports the donor film 20 between the acceptor substrate 10 and the first gripper 200, rather than supporting the donor film 20 between the acceptor substrate 10 and the first filling roll 300, to delaminate the donor film 20 from the lower support 30. Accordingly, a failure that may occur in the acceptor substrate 10 due to air suction or blowing of the first filling roll 300 can be preemptively prevented.

Further, the first filling roll 300 supports the donor film 20 by air suction or blowing toward the donor film 20, so that the donor film 20 can be prevented from being separated from the first filling roll 300. This can improve reliability of the entire delamination process.

Also, when the first filling roll 300 blows air, including positive ions or negative ions, toward the donor film 20 to delaminate the donor film 20 from the lower support 30, electrostatic energy generated between the donor film 20 and the acceptor substrate 10 is suppressed. This may suppress damage to the acceptor substrate 10 due to the electrostatic energy.

Hereinafter, the acceptor substrate 10, from which the donor film 20 is delaminated, will be described.

Figure 13:
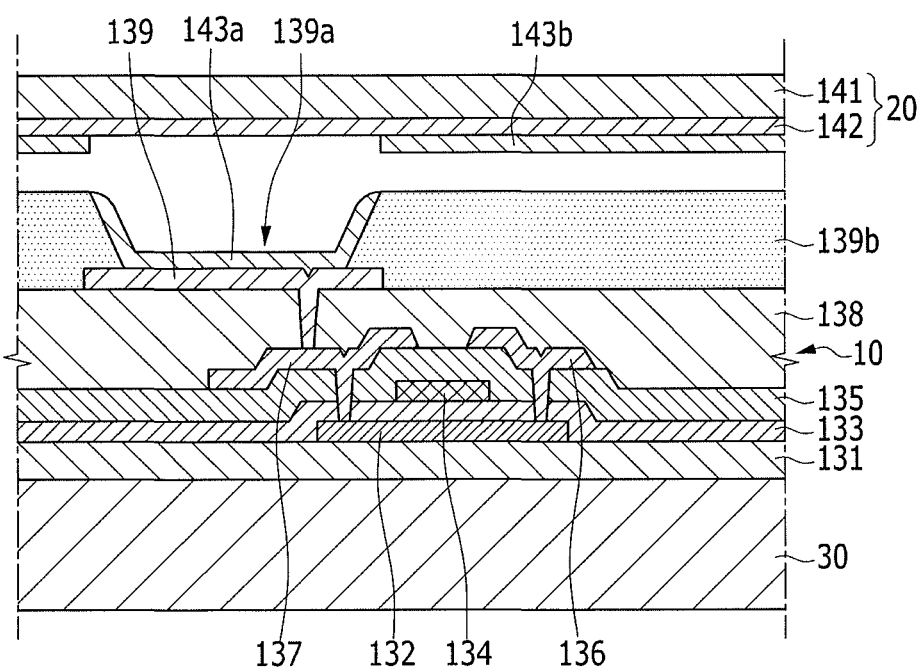
FIG. 13 illustrates a cross-sectional view of an acceptor substrate delaminated with a donor film through the delamination process shown in FIG. 9 to FIG. 12.

FIG. 13 illustrates a cross-sectional view of the acceptor substrate 10, from which the donor film 20 is delaminated through the delamination process shown in FIG. 9 to FIG. 12.

As shown in FIG. 13, since the donor film 20 is separated from the acceptor substrate 10, an organic layer 143a transferred in correspondence to the opening 139a of the acceptor substrate 10 is separated from an organic layer 143b remaining in the donor film 20. The organic layer 143a functions as a light emission layer of an organic light emitting element.

As described above, the inline thermal imaging system according to the first exemplary embodiment may include the lamination apparatus 1000, the transport apparatus 2000, and the delamination apparatus 3000, which share the stage 100. The inline thermal imaging system according to the first exemplary embodiment may perform the lamination process, the imaging process, and the delamination process in an inline manner.

Furthermore, the inline thermal imaging system according to the first exemplary embodiment performs the lamination process, the imaging process, and the delamination process using one stage 100. The lamination process, the imaging process, and the delamination process can be performed without the lower support 30 by directly attaching the donor film 20 to the stage 100 to seal the acceptor substrate 10. Accordingly, manufacturing time and manufacturing cost can be reduced.

Also, in the delamination apparatus 3000 of the inline thermal imaging system according to the first exemplary embodiment, when delaminating the donor film 20, which may be a dielectric material from the acceptor substrate 10, the donor film 20 may be substantially delaminated from the acceptor substrate 10 while blowing positive ions or negative ions toward the donor film 20. As such, the electrostatic energy between the acceptor substrate 10 and the donor film 20 is suppressed. That is, the delamination apparatus 3000 suppresses the acceptor substrate 10 from being damaged by electrostatic energy.

Also, in the delamination apparatus 3000 of the inline thermal imaging system according to the first exemplary embodiment, when delaminating the donor film 20 from the acceptor substrate 10, the donor film 20 is separated from the acceptor substrate 10 while blowing positive ions or negative ions toward the donor film 20 at a uniform pressure. Accordingly, the donor film 20 may be substantially discharged, thereby minimizing stress applied to the acceptor substrate 10 by the donor film 20. That is, the delamination apparatus 3000 suppresses the acceptor substrate 10 from being damaged by undesired stress when delaminating the donor film 20 from the acceptor substrate 10.

Further, the delamination apparatus 3000 of the inline thermal imaging system according to the first exemplary embodiment does not require an additional electricity removing apparatus. As such, the delamination process and an electricity removing process may be simultaneously performed for the donor film 20 in a limited space.

Hereinafter, a delamination apparatus according to a second exemplary embodiment will be described with reference to FIG. 14.

As compared to the delamination apparatus according to the first embodiment, only distinguishing elements of the delamination apparatus according to the second embodiment will be described. Since the remaining elements of the delamination apparatus according to the second embodiment have similar configurations, the detailed description thereof will be omitted herein. For better comprehension and ease of description, identical constituent elements between the first embodiment and the second embodiment will be described using the same reference numerals.

Figure 14:
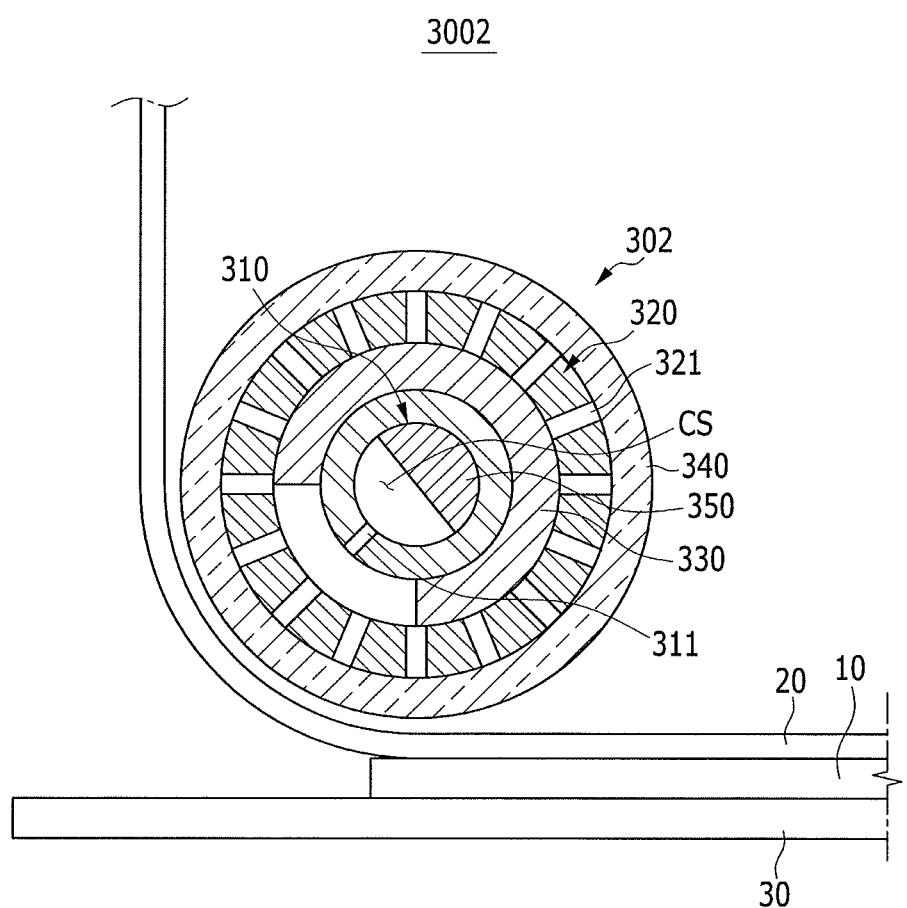
FIG. 14 illustrates a view of a delamination apparatus according to a second exemplary embodiment.

FIG. 14 illustrates a delamination apparatus 3002 in accordance with the second exemplary embodiment. For better understanding and ease of description, FIG. 14 mainly shows a first filling roll 302.

As shown in FIG. 14, the first filling roll 302 of the delamination apparatus 3002 according to the second exemplary embodiment may include the fixing shaft 310, the external roll 320, the barrier 330, the cover 340, and a first ionizer 350.

The fixing shaft 310 includes the connection space CS, through which air or a gas, such as nitrogen (N) or oxygen (O), blows, and the first slit 311 penetrating in a direction between the acceptor substrate 10 and the first gripper 200 from the inside of the connection space CS. The fixing shaft 310 is disposed in a fixed state on the donor film 20, and does not rotate. The fixing shaft 310 may be connected to an air supply unit (not shown) supplying the air to the connection space CS.

The first ionizer 350 is positioned in the connection space CS as an internal portion of the fixing shaft 310, and generates ions, that may be positive ions or negative ions, in a direction of the first slit 311. The first ionizer 350 may include an electrode tip supplied with power to generate positive ions or negative ions. The first ionizer 350 may selectively generate the positive ions or the negative ions corresponding to positive charges and negative charges arranged at the surface of the donor film 20 according to each material of the acceptor substrate 10 and the donor film 20.

The air passes through the connection space CS of the fixing shaft 310, and the first ionizer 350 is positioned at the connection space CS such that the air, including the ions moving through the first slit 311, is blown to the donor film 20 positioned outside the first filling roll 302 through the second slit 321.

As described above, by blowing the air including the positive ions or the negative ions to the donor film 20 through the first filling roll 302, when delaminating the donor film 20 from the lower support 30, the electrostatic energy generated between the donor film 20 and the acceptor substrate 10 is suppressed. Therefore, damage to the acceptor substrate 10 due to the electrostatic energy may be prevented or substantially minimized.

Also, in the delamination apparatus 3002 of the inline thermal imaging system according to the second exemplary embodiment, when delaminating the donor film 20 that may be the dielectric material from the acceptor substrate 10, the donor film 20 is substantially delaminated from the acceptor substrate 10 while blowing the positive ions or the negative ions to the donor film 20 such that the electrostatic energy between the acceptor substrate 10 and the donor film 20 is suppressed. That is, the delamination apparatus 3002 exhibits improved performance by preventing or substantially minimizing damage to the acceptor substrate 10.

Hereinafter, a delamination apparatus according to a third exemplary embodiment will be described with reference to FIG. 15.

Only characteristic parts different from the first embodiment will be described and parts whose description is omitted follow the first embodiment. For better comprehension and ease of description, identical constituent elements between the first embodiment and the third embodiment will be described using the same reference numerals.

Figure 15:
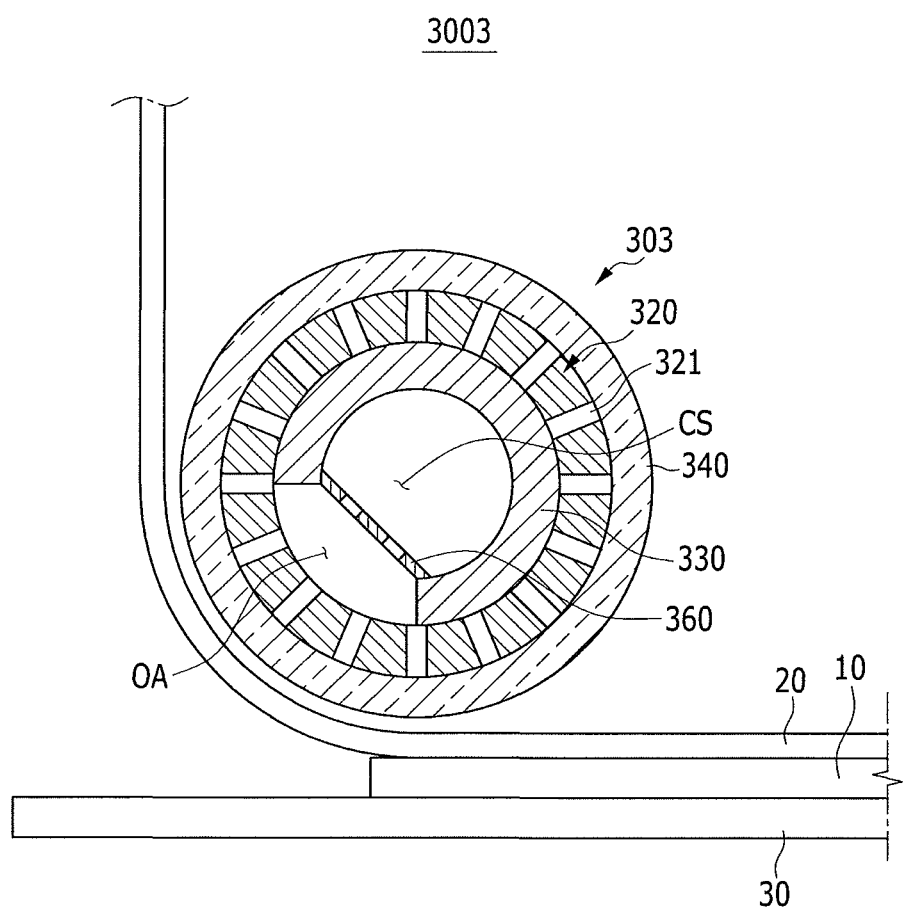
FIG. 15 illustrates a view of a delamination apparatus according to a third exemplary embodiment.

FIG. 15 illustrates a view of a delamination apparatus 3003 according to the third exemplary embodiment. For better understanding and ease of description, FIG. 15 focuses on a first filling roll 303.

As shown in FIG. 15, the first filling roll 303 of the delamination apparatus 3003 according to the third exemplary embodiment may include the barrier 330, the external roll 320, the cover 340, and a second ionizer 360.

The barrier 330 includes the connection space CS, through which air or a gas such as nitrogen (N) or oxygen (O) passes, and the opening area OA opening in the direction between the acceptor substrate 10 and the first gripper 200 from the inside of the connection space CS. The opening area OA of the barrier 330 opens a quarter of the entire area of the external circumference of the barrier 330. For example, the opening area OA of the barrier 330 opens the area in a direction rotated 90 degrees in a clockwise direction from a direction that is perpendicular to the plate surface of the donor film 20 among the entire area of the external circumference of the barrier 330. The barrier 330 is disposed in a fixed state on the donor film 20, and does not rotate. The barrier 330 may be connected to an air supply unit (not shown) supplying the air to the connection space CS.

The second ionizer 360 is disposed to traverse the opening area OA of the opened area of the barrier 330 and to generate ions, which may be positive ions or negative ions. The second ionizer 360 may include an electrode tip supplied with power to generate positive ions or negative ions. Also, the second ionizer 360 may selectively generate the positive ions or the negative ions corresponding to the positive charges and the negative charges arranged at the surface of the donor film 20 according to each material of the acceptor substrate 10 and the donor film 20. The air passing through the connection space CS of the barrier 330 may be moved outside the first filling roll 303 through the second ionizer 360.

The air passes through the connection space CS of the barrier 330 and the second ionizer 360 is positioned at the opening area OA opening the connection space CS such that the air including the ions is blown to the donor film 20 positioned outside the first filling roll 303 through the second slit 321.

As described above, by blowing the air including the positive ions or the negative ions to the donor film 20 through the first filling roll 302, when delaminating the donor film 20 from the lower support 30, the electrostatic energy generated between the donor film 20 and the acceptor substrate 10 is suppressed. Therefore, damage to the acceptor substrate 10 due to the electrostatic energy may be prevented or substantially minimized.

Also, in the delamination apparatus 3003 of the inline thermal imaging system according to the third exemplary embodiment, when delaminating the donor film 20 that may be the dielectric material from the acceptor substrate 10, the donor film 20 is substantially delaminated from the acceptor substrate 10 while blowing the positive ions or the negative ions to the donor film 20 such that the electrostatic energy between the acceptor substrate 10 and the donor film 20 is suppressed. That is, the delamination apparatus 3003 exhibits improved performance by preventing or substantially minimizing damage to the acceptor substrate 10.

Hereinafter, a delamination apparatus according to a fourth exemplary embodiment will be described with reference to FIG. 16.

Only characteristic parts different from the first embodiment will be described and parts whose description is omitted follow the first embodiment. For better comprehension and ease of description, identical constituent elements between the first embodiment and the fourth embodiment will be described using the same reference numerals.

Figure 16:
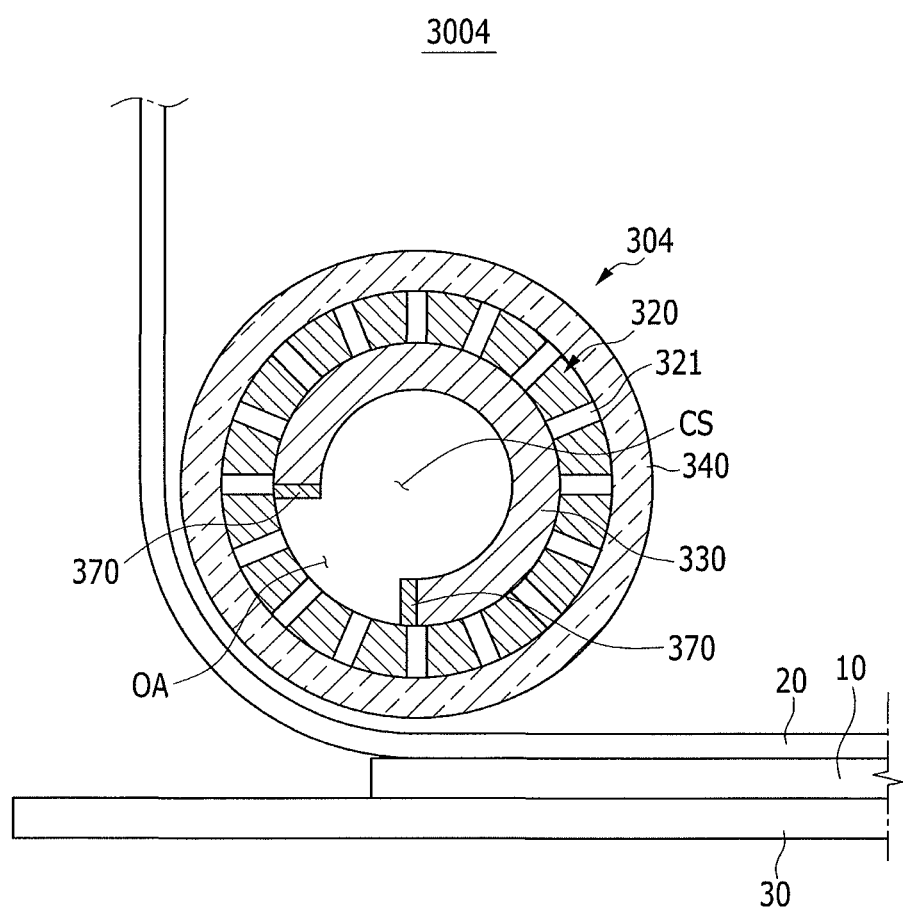
FIG. 16 illustrates a view of a delamination apparatus according to a fourth exemplary embodiment.

FIG. 16 illustrates a view of a delamination apparatus 3004 according to the fourth exemplary embodiment. For better understanding and ease of description, FIG. 16 focuses on a first filling roll 304.

As shown in FIG. 16, the first filling roll 304 of the delamination apparatus 3004 according to the fourth exemplary embodiment may include the barrier 330, the external roll 320, the cover 340, and a third ionizer 370.

The barrier 330 may include the connection space CS through which air or a gas such as nitrogen (N) or oxygen (O) passes, and the opening area OA opening in the direction between the acceptor substrate 10 and the first gripper 200 from the inside of the connection space CS. The opening area OA of the barrier 330 opens a quarter of the entire area of the external circumference of the barrier 330. For example, the opening area OA of the barrier 330 opens the area in a direction rotated 90 degrees in a clockwise direction from a direction that is perpendicular to the plate surface of the donor film 20 among the entire area of the external circumference of the barrier 330. The barrier 330 is disposed in the fixed stated on the donor film 20, and does not rotate. The barrier 330 may be connected to an air supply unit (not shown) supplying the air to the connection space CS.

The third ionizer 370 is respectively disposed at both ends of the barrier 330 adjacent to the opening area OA of the barrier 330, and generates the ions that may be positive ions or negative ions. The third ionizer 370 may include an electrode tip supplied with power to generate positive ions or negative ions. Also, the third ionizer 370 may selectively generate the positive ions or the negative ions corresponding to the positive charges and the negative charges arranged at the surface of the donor film 20 according to each material of the acceptor substrate 10 and the donor film 20. The air passing through the connection space CS of the barrier 330 may be moved outside the first filling roll 303 through the opening area OA.

The air passes through the connection space CS of the barrier 330 and the third ionizer 370 that is respectively disposed at both ends of the barrier 330 adjacent to the opening area OA of the connection space CS such that the air including the ions is blown to the donor film 20 positioned outside the first filling roll 303 through the second slit 321.

As described above, by blowing the air including the positive ions or the negative ions to the donor film 20 through the first filling roll 302, when delaminating the donor film 20 from the lower support 30, the electrostatic energy generated between the donor film 20 and the acceptor substrate 10 is suppressed. Therefore, damage to the acceptor substrate 10 due to the electrostatic energy may be prevented or substantially minimized.

Also, in the delamination apparatus 3004 of the inline thermal imaging system according to the fourth exemplary embodiment, when delaminating the donor film 20 that may be the dielectric material from the acceptor substrate 10, the donor film 20 is substantially delaminated from the acceptor substrate 10 while blowing the positive ions or the negative ions to the donor film 20 such that the electrostatic energy between the acceptor substrate 10 and the donor film 20 is suppressed. That is, the delamination apparatus 3004 exhibits improved performance by preventing or substantially minimizing damage to the acceptor substrate 10.

Hereinafter, a delamination apparatus according to a fifth exemplary embodiment will be described with reference to FIG. 17.

Only characteristic parts different from the first embodiment will be described and parts whose description is omitted follow the first embodiment. For better comprehension and ease of description, identical constituent elements between the first embodiment and the fifth embodiment will be described using the same reference numerals.

Figure 17:
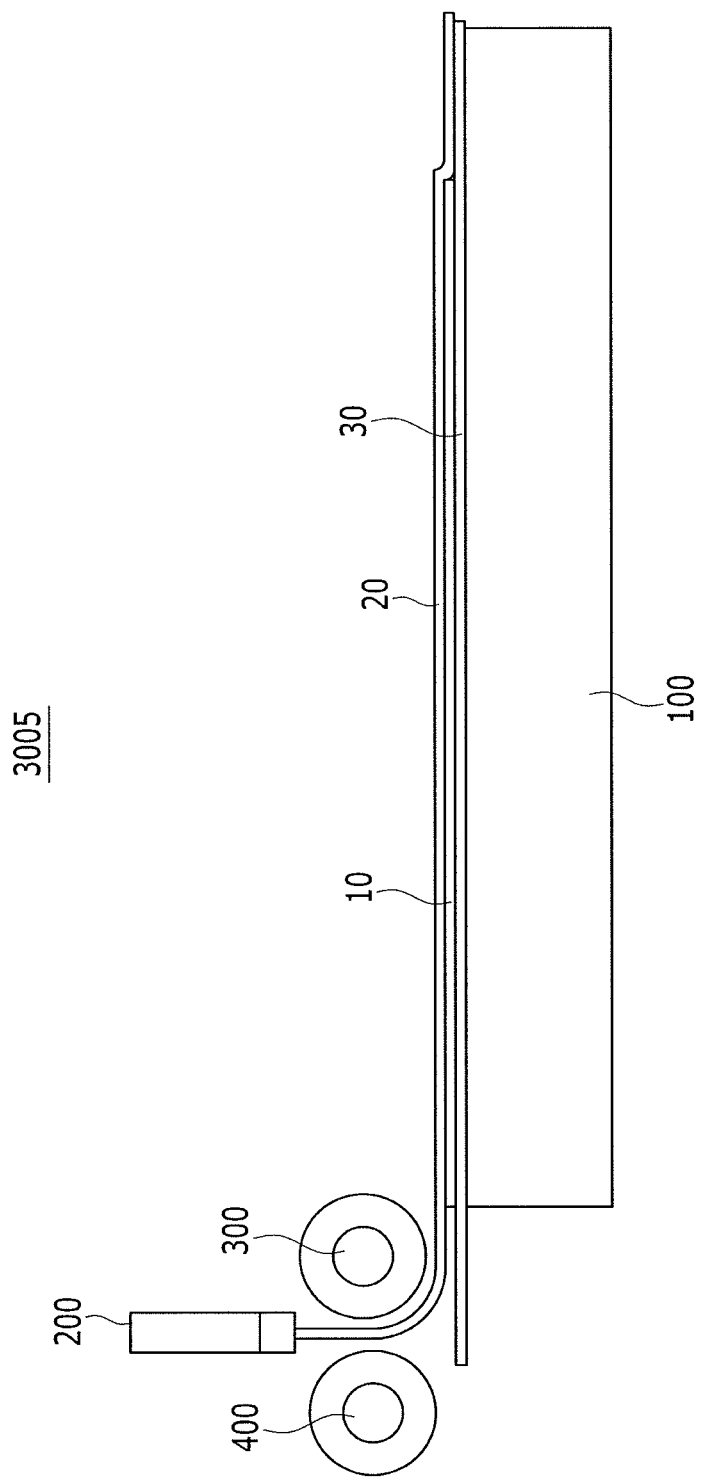
FIG. 17 illustrates a view of a delamination apparatus according to a fifth exemplary embodiment.

FIG. 17 illustrates a view of a delamination apparatus according to the fifth exemplary embodiment.

As shown in FIG. 17, a delamination apparatus 3005 according to the fifth exemplary embodiment further includes a first supporting roll 400. The first supporting roll 400 faces the first filling roll 300 via the donor film 20. When delaminating the donor film 20 from the lower support 30, the donor film 20 is supported between the first filling roll 300 and the first supporting roll 400.

Like the first filling roll 300, the first supporting roll 400 may include a fixing shaft, an external roll, a barrier, and a cover. The fixing shaft, the external roll, the barrier, and the cover included in the first supporting roll 400 may have the same shape as the fixing shaft 310, the external roll 320, the barrier 330, and the cover 340 included in the first filling roll 300. Also, the first supporting roll 400 may have the same shape as one of the first filling rolls 302, 303, and 304 according to the second exemplary embodiment, the third exemplary embodiment, and the fourth exemplary embodiment.

As described above, in the delamination apparatus 3005 according to the fifth exemplary embodiment, the donor film 20 positioned between the acceptor substrate 10 and the first gripper 200 is supported between the first filling roll 300 and the first supporting roll 400 to be delaminated from the lower support 30. As such, failure that may be potentially generated in the acceptor substrate 10 may be preemptively prevented through the blowing and the electricity removing by the first filling roll 300 and the first supporting roll 400.

Hereinafter, a delamination apparatus according to a sixth exemplary embodiment will be described with reference to FIG. 18.

Only characteristic parts different from the first embodiment will be described and parts whose description is omitted follow the first embodiment. For better comprehension and ease of description, identical constituent elements between the first embodiment and the sixth embodiment will be described using the same reference numerals.

Figure 18:
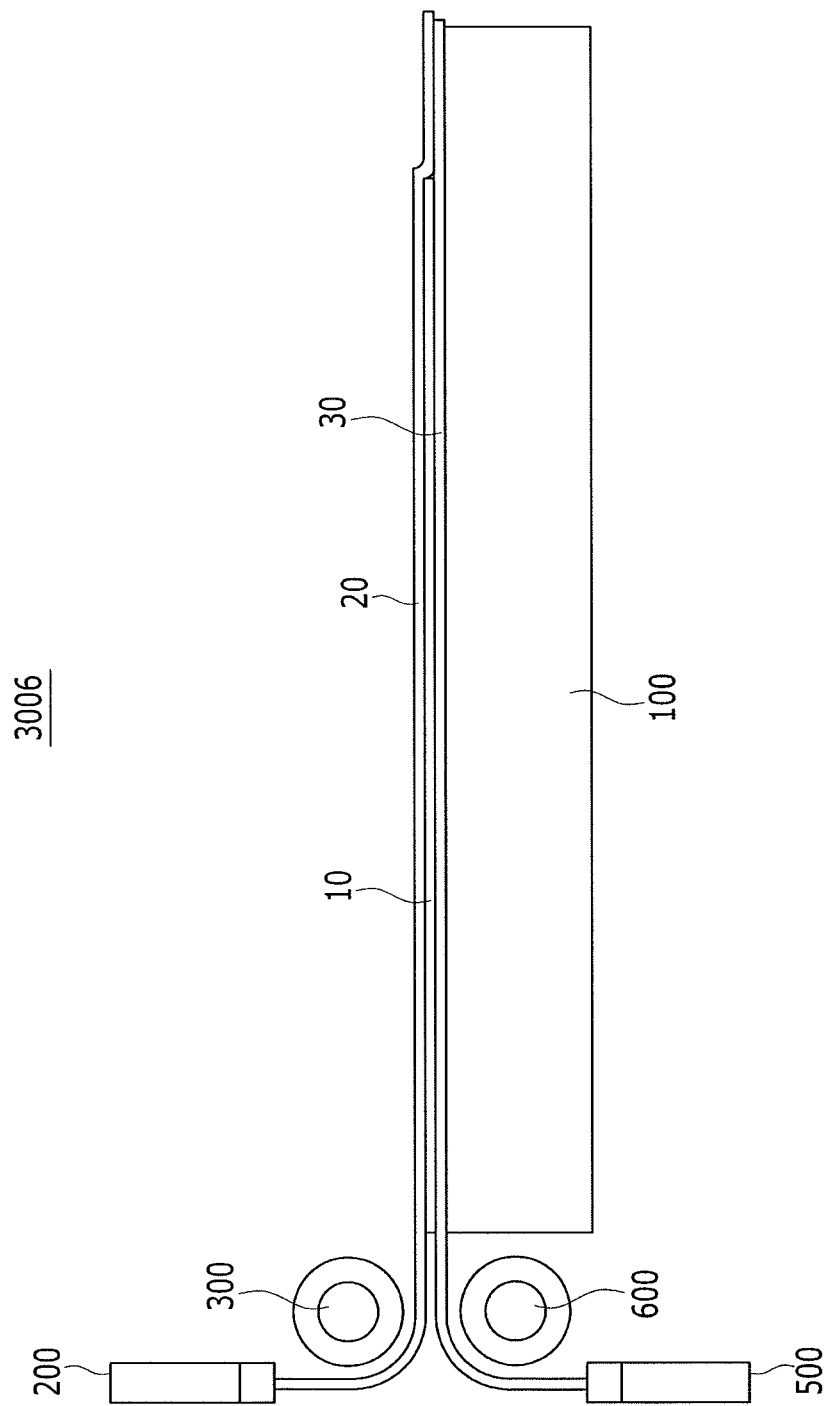
FIG. 18 illustrates a view of a delamination apparatus according to a sixth exemplary embodiment.

FIG. 18 illustrates a view of a delamination apparatus 3006 according to the sixth exemplary embodiment. As shown in FIG. 18, the delamination apparatus 3006 according to the sixth exemplary embodiment further includes a second gripper 500 and a second filling roll 600.

The second gripper 500 may be positioned at the end side of the stage 100 to grip the end of the lower support 30. The second gripper 500 grips the end of the lower support 30 to be moved in a direction away from the acceptor substrate 10, e.g., the lower side, such that the end of the lower support 30 is separated from the acceptor substrate 10. When the second gripper 500 separates the end of the lower support 30 from the acceptor substrate 10, the lower support 30 is supported by the second filling roll 600.

The second filling roll 600 is positioned on the lower support 30. The second filling roll 600 supports the lower support 30 positioned between the acceptor substrate 10 and the second gripper 500. Here, supporting of the lower support 30 implies blowing air or gas toward the lower support 30 to support, e.g., maintain in place, the lower support 30.

The second filling roll 600 rotates itself in a direction of the second gripper 500. For example, the second filling roll 600 rotates in the counterclockwise direction to delaminate the donor 20 from the lower support 30.

Like the first filling roll 300, the second filling roll 600 may include a fixing shaft, an external roll, a barrier, and a cover. The fixing shaft, the external roll, the barrier, and the cover included in the second filling roll 600 may have the same shape as the fixing shaft 310, the external roll 320, the barrier 330, and the cover 340 included in the first filling roll 300. Also, the second filling roll 600 may have the same shape as one of the first filling rolls 302, 303, and 304 according to the second exemplary embodiment, the third exemplary embodiment, and the fourth exemplary embodiment.

As described above, in the delamination apparatus 3005 according to the sixth exemplary embodiment, the donor film 20 between the acceptor substrate 10 and the first gripper 200 is supported by the first filling roll 300 to be delaminated from the lower support 30. Simultaneously, the lower support 30 between the acceptor substrate 10 and the second gripper 500 is supported by the second filling roll 600 to be delaminated from the donor film 20. Therefore, a potential failure that may be generated in the acceptor substrate 10 may be preemptively prevented or substantially minimized by air blowing and the electricity removing via the first filling roll 300 and the second filling roll 600.

Hereinafter, a delamination apparatus according to a seventh exemplary embodiment will be described with reference to FIG. 19.

Only characteristics parts different from the first embodiment will be described and parts whose description is omitted follows the first embodiment. For better comprehension and ease of description, identical constituent elements between the first embodiment and the seventh embodiment will be described using the same reference numerals.

Figure 19:
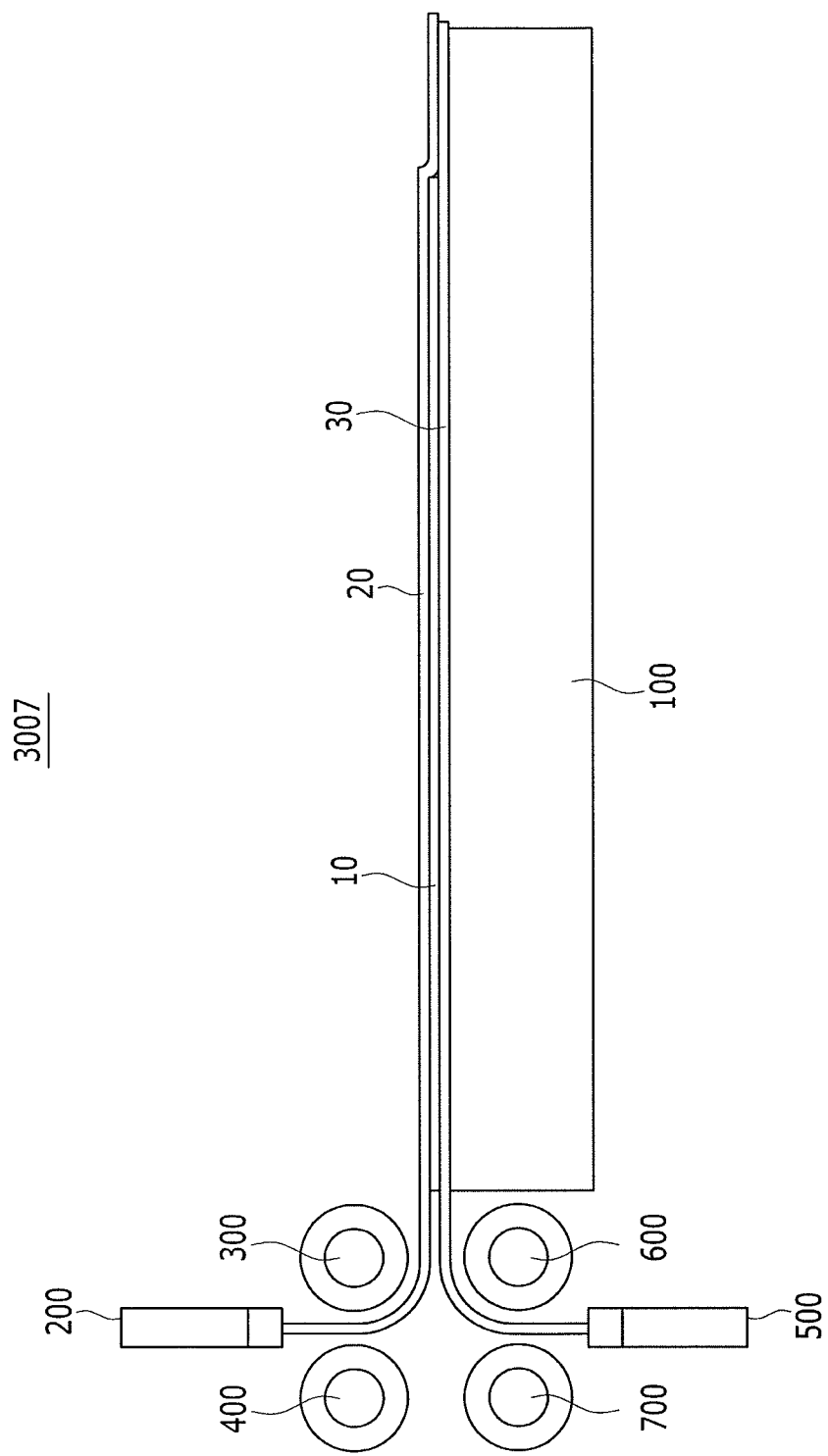
FIG. 19 illustrates a view of a delamination apparatus according to a seventh exemplary embodiment.

FIG. 19 illustrates a view of a delamination apparatus according to the seventh exemplary embodiment.

As shown in FIG. 19, a delamination apparatus 3007 according to the seventh exemplary embodiment may include the first supporting roll 400, the second gripper 500, the second filling roll 600, and a second supporting roll 700.

The first supporting roll 400 faces the first filling roll 300 via the donor film 20, and when delaminating the donor film 20 from the lower support 30, the donor film 20 is supported between the first filling roll 300 and the first supporting roll 400. Like the first filling roll 300, the first supporting roll 400 may include a fixing shaft, an external roll, a barrier, and a cover. The fixing shaft, the external roll, the barrier, and the cover included in the first supporting roll 400 may have the same shape as the fixing shaft 310, the external roll 320, the barrier 330, and the cover 340 included in the first filling roll 300. Also, the first supporting roll 400 may have a same shape as one of the first filling rolls 302, 303, and 304 according to the second exemplary embodiment, the third exemplary embodiment, and the fourth exemplary embodiment.

The second gripper 500 is positioned at the end side of the stage 100 and grips the end of the lower support 30. The second gripper 500 grips the end of the lower support 30 to be moved in a direction oriented away from the acceptor substrate 10, e.g., the lower side, such that the end of the lower support 30 is separated from the acceptor substrate 10. When the second gripper 500 separates the end of the lower support 30 from the acceptor substrate 10, the lower support 30 is supported by the second filling roll 600.

The second filling roll 600 is positioned on the lower support 30. The second filling roll 600 supports the lower support 30 positioned between the acceptor substrate 10 and the second gripper 500. Here, the supporting of the lower support 30 implies blowing air toward the lower support 30 to be supported. The second filling roll 600 rotates itself in a direction of the second gripper 500. For example, the second filling roll 600 rotates in the counterclockwise direction to delaminate the donor 20 from the lower support 30.

Like the first filling roll 300, the second filling roll 600 may include a fixing shaft, an external roll, a barrier, and a cover. The fixing shaft, the external roll, the barrier, and the cover included in the second filling roll 600 may have the same shape as the fixing shaft 310, the external roll 320, the barrier 330, and the cover 340 included in the first filling roll 300. Also, the second filling roll 600 may have the same shape as one of the first filling rolls 302, 303, and 304 according to the second exemplary embodiment, the third exemplary embodiment, and the fourth exemplary embodiment.

The second supporting roll 700 faces the second filling roll 600 via the lower support 30, and when delaminating the lower support 30 from the donor film 20, the lower support 30 is supported between the second filling roll 600 and the second supporting roll 700. Like the first filling roll 300, the second supporting roll 700 may include a fixing shaft, an external roll, a barrier, and a cover. The fixing shaft, the external roll, the barrier, and the cover included in the second supporting roll 700 may have the same shape as the fixing shaft 310, the external roll 320, the barrier 330, and the cover 340 included in the first filling roll 300. Also, the second supporting roll 700 may have the same shape as one of the first filling rolls 302, 303, and 304 according to the second exemplary embodiment, the third exemplary embodiment, and the fourth exemplary embodiment.

As described above, in the delamination apparatus 3007 according to the seventh exemplary embodiment, the donor film 20 between the acceptor substrate 10 and the first gripper 200 is supported between the first filling roll 300 and the first supporting roll 400 to be delaminated from the lower support 30, and simultaneously, the lower support 30 between the acceptor substrate 10 and the second gripper 500 is supported between the second filling roll 600 and the second supporting roll 700 to be delaminated from the donor film 20. Therefore, a potential failure that may be generated in the acceptor substrate 10 may be preemptively prevented through the blowing and the electricity removing by the first filling roll 300, the first supporting roll 400, the second filling roll 600, and the second supporting roll 700.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A delamination apparatus, comprising:
    a stage mounted with a lower supporting member, a donor film laminated to the lower supporting member, and an acceptor substrate sealed between the lower supporting member and the donor film;
    a first gripper positioned at an end side of the stage, the first gripper being configured to grip an end of the donor film and to move with the end of the donor film away from the acceptor substrate; and
    a first filling roll positioned over the donor film, the first filling roll being configured to blow ions toward the donor film while rotating toward the first gripper.

2. The delamination apparatus as claimed in claim 1, wherein the first filling roll includes:
    a fixing shaft having a first slit penetrating therethrough, the first slit being oriented from an interior of the fixing shaft toward a point between the acceptor substrate and the first gripper, air including the ions passing through the fixing shaft;
    an external roll surrounding the fixing shaft, the external roll rotating with respect to the fixing shaft and including a plurality of second slits along an external circumference of the external roll, the second slits penetrating in a direction of the fixing shaft; and
    a barrier supported by the fixing shaft, the barrier being positioned between the fixing shaft and the external roll, and the barrier including an opening facing the point between the acceptor substrate and the first gripper.

3. The delamination apparatus as claimed in claim 2, wherein the first filling roll further comprises a first ionizer inside the fixing shaft, the first ionizer being configured to generate ions toward a direction of the first slit.

4. The delamination apparatus as claimed in claim 2, wherein the first filling roll further comprises a second ionizer traversing the opening of the barrier, the second ionizer being configured to generate ions toward a direction of the first slit.

5. The delamination apparatus as claimed in claim 2, wherein:
    the barrier includes two ends facing each other, the opening being defined between the two ends, and
    the first filling roll further comprises a second ionizer at the two ends of the barrier, the second ionizer being configured to generate ions toward a direction of the first slit.

6. The delamination apparatus as claimed in claim 2, wherein the opening of the barrier extends along a quarter of a circumference of the barrier.

7. The delamination apparatus as claimed in claim 2, wherein the first filling roll further comprises a cover surrounding the external roll.

8. The delamination apparatus as claimed in claim 7, wherein the cover includes:
    a first sub-cover overlapping the end of the donor film and blocking the second slit;
    a second sub-cover adjacent to the first sub-cover and overlapping a portion of the donor film laminated with the lower supporting member, the second sub-cover including a plurality of first penetration holes; and
    a third sub-cover adjacent to the second sub-cover and corresponding to the acceptor substrate, the third sub-cover including a plurality of second penetration holes smaller than the first penetration holes.

9. The delamination apparatus as claimed in claim 1, further comprising a second supporting roll facing the first filling roll via the donor film.

10. The delamination apparatus as claimed in claim 1, further comprising:
    a second gripper at an end side of the stage to grip an end of the lower supporting member, the second gripper being configured to move the end of the lower supporting member in a direction away from the acceptor substrate; and
    a second filling roll over the lower supporting member to support the lower supporting member disposed between the acceptor substrate and the second gripper, the second filling roll being configured to rotate in a direction of the second gripper.

11. The delamination apparatus as claimed in claim 10, further comprising a second support roll adjacent the second filling roll, the lower supporting member being between the second filling roll and the second support roll.

12. The delamination apparatus as claimed in claim 1, wherein the ions are positive ions or negative ions.

13. An inline thermal imaging system, comprising:
the delamination apparatus as claimed in claim 1;
a transferring apparatus adjacent the delamination apparatus, the transferring apparatus including a laser unit irradiating laser beams to the donor film;
a lamination apparatus adjacent the transferring apparatus, the lamination apparatus including a lamination unit laminating the donor film to the lower supporting member; and
a stage movement apparatus respectively moving the stage to the lamination apparatus, the transferring apparatus, and the delamination apparatus.

* * * * *